US011424615B2

(12) United States Patent
Meng et al.

(10) Patent No.: US 11,424,615 B2
(45) Date of Patent: Aug. 23, 2022

(54) INTEGRITY MONITORING FOR INPUT/OUTPUT (IO) CIRCUITS OF A SYSTEM ON A CHIP (SOC)

(71) Applicant: NXP USA, Inc., Austin, TX (US)

(72) Inventors: Kuo-Hsuan Meng, Austin, TX (US); Gayathri Bhagavatheeswaran, Austin, TX (US); Hector Sanchez, Austin, TX (US)

(73) Assignee: NXP USA, Inc., Austin, TX (US)

( * ) Notice: Subject to any disclaimer, the term of this patent is extended or adjusted under 35 U.S.C. 154(b) by 174 days.

(21) Appl. No.: 16/886,970

(22) Filed: May 29, 2020

(65) Prior Publication Data
US 2021/0376599 A1 Dec. 2, 2021

(51) Int. Cl.
*H02H 9/04* (2006.01)
*H02H 1/00* (2006.01)

(52) U.S. Cl.
CPC .......... *H02H 9/046* (2013.01); *H02H 1/0007* (2013.01)

(58) Field of Classification Search
CPC ... H02H 9/046; H02H 1/0007; G01R 31/2851
USPC .......................................................... 361/56
See application file for complete search history.

(56) References Cited

U.S. PATENT DOCUMENTS

| 7,710,696 | B2 | 5/2010 | Ker et al. |
| 7,826,187 | B2 | 11/2010 | Ker et al. |
| 10,164,426 | B2 | 12/2018 | Stockinger et al. |
| 10,191,109 | B2 | 1/2019 | Dunnihoo et al. |
| 2003/0201778 | A1 | 10/2003 | Kraz |
| 2008/0297242 | A1 | 12/2008 | Vig et al. |
| 2011/0101998 | A1 | 5/2011 | Myers et al. |
| 2013/0107640 | A1 | 5/2013 | Yamada |
| 2013/0314824 | A1 | 11/2013 | Lefferts et al. |
| 2015/0280415 | A1* | 10/2015 | Welty ..................... H02H 9/046 361/56 |

OTHER PUBLICATIONS

Chen et al.: "On-Chip Transient Detection Circuit for Microelectronic Systems Against Electrical Transient Disturbances due to ESD Events", 2018 IEEE Region Ten Symposium (Tensymp), Jul. 4-6, 2018, Sydney, Australia, pp. 36-39.

(Continued)

*Primary Examiner* — Dharti H Patel

(57) ABSTRACT

An integrated circuit (IC) includes an input/output (IO) circuit in a first power domain, coupled between a first and second power supply terminal, and an integrity monitor in a second power domain, coupled between a third and fourth power supply terminal. The IO circuit includes an external terminal configured to communicate signals external to the IC, and an internal circuit node configured to provide a tap signal, wherein the internal circuit node is neither the first power supply terminal nor the second power supply terminal. The integrity monitor has a counter configured to provide a count value by counting each time the tap signal reaches a threshold voltage, and is configured to provide an integrity fault indicator based at least in part on the count value, in which the integrity fault indicator indicates whether or not a signal provided or received by the external terminal is trustworthy.

20 Claims, 4 Drawing Sheets

(56) References Cited

OTHER PUBLICATIONS

Han et al.: "Four-bit Transient-to-Digital Converter with a Single RC-Based Detection Circuit for System-Level ESD Protection", 2015 IEEE 11th International Conference on ASIC (ASICON), Nov. 2-6, 2015, Chengdu, China, pp. 1-4.
U.S. Appl. No. 16/279,777, Meng, Kuo-Hsuan: "ESD Protection Circuit Providing Multiple Detection Signals", filed Feb. 19, 2019.

\* cited by examiner

INTEGRITY MONITORING FOR INPUT/OUTPUT (IO) CIRCUITS OF A SYSTEM ON A CHIP (SOC)

BACKGROUND

Field

This disclosure relates generally to integrity monitoring, and more specifically, to integrity monitoring for input/output (IO) circuits of a System on a Chip (SoC).

Related Art

Input-output (IO) circuits of a System on a Chip (SoC) commonly include Electrostatic Discharge (ESD) protection circuits. However, the ESD protection circuit itself may malfunction and cause disturbance to the associated power supply and possibly to circuit operation in the associated power domain. Furthermore, these disturbances can render communication to and from the SoC via the IO circuits unreliable.

The functional safety of an SoC relies on the correct communication between the SoC and the external blocks it interfaces. Any signal communication in an SoC is performed via an IO buffer circuit which resides at each of its signal pins. This IO buffer circuitry includes an actual signal processing circuit and the ESD circuit. The signal communication capability not only depends on the signal processing circuitry, but also on the ESD circuitry. When either circuitry malfunctions, the reliability of operation for its intended function is severely compromised. The impact of this malfunction is multi-fold. It can affect the normal function of data transactions. It can also put the SoC into an unsafe operation condition, thus compromising functional safety. In some applications, such as in some automotive applications, functional safety is critical. Therefore, a need exists for monitoring and detecting disturbances in order to help determine safe or unsafe operation of the SoC.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Stability in the power domain of IO circuitry is necessary for correct communication of an SoC with any external chips. However, as discussed above, circuitry within IO circuits of the SoC, such as ESD protection circuits, may malfunction and cause disturbance and instability in the power domain of the IO circuits. In one aspect, one or more integrity monitors are used to monitor tap signals from internal nodes of IO circuits. Any disturbances indicated by the tap signals may be caused by disturbances in the corresponding power domain. If an integrity monitor determines a disturbance in a tap signal, then an integrity fault indicator is asserted to indicate that the integrity of any signal processed by the IO circuit may be questionable and thus untrustworthy. In one embodiment, an integrity monitor uses a counter to monitor a tap signal from an internal node of an IO circuit, such as within an ESD protection circuit of the IO circuit, and uses a count value of the counter to provide a corresponding integrity fault indicator. For example, the counter may count each time the tap signal fluctuates and crosses a predetermined threshold. When the count value reaches a particular value, the integrity fault indicator is asserted to indicate that the integrity of a signal provided by or received at the corresponding IO circuit is questionable and cannot be deemed trustworthy.

Figure 1:
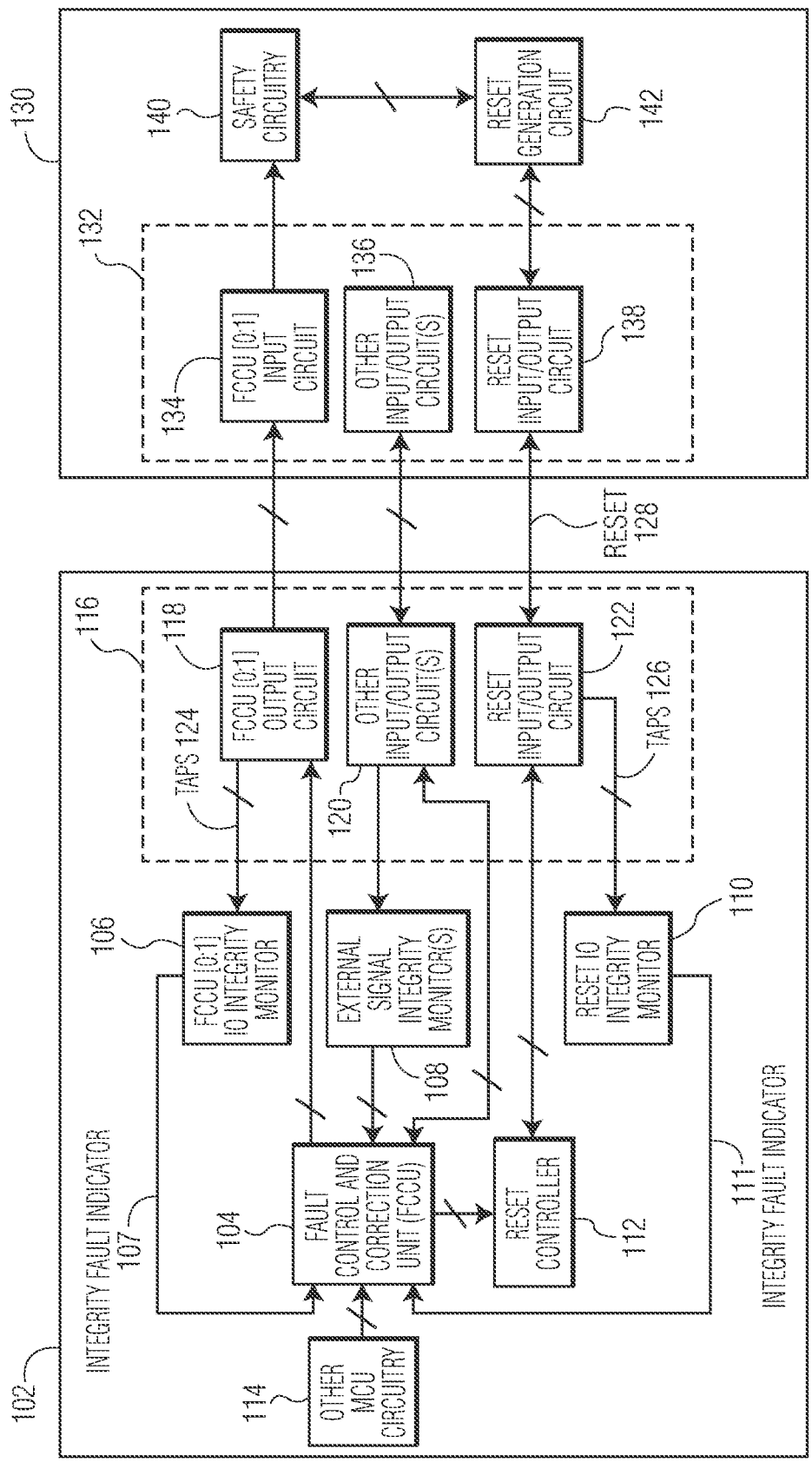
FIG. 1 illustrates, in block diagram form, a system having an SoC and an external chip, in accordance with one embodiment of the present invention.

FIG. 1 illustrates, in block diagram form, a system 100, in accordance with one embodiment of the present invention. System 100 includes an SoC 102 and an external chip 130, external to SoC 102. In the illustrated embodiment, SoC 102 includes a microcontroller (MCU), but alternate embodiments, may include any type of circuitry or data processing system, such as a microprocessor, digital signal processor, etc. In one embodiment, SoC 102 includes a plurality of IO pads and corresponding IO circuitry implemented in an IO padring at the periphery of the die to communicate with circuitry external to SoC 102. Likewise, external chip 130 can include any type of circuitry or data processing system and may also include a plurality of IO pads and corresponding IO circuitry implemented in an IO padring. Note that the IO circuitry of either SoC 102 or 130 may also include ESD protection circuitry for one or more of the IO pads.

In the illustrated embodiment, SoC 102 includes an IO padring 116, a fault control and correction unit (FCCU) 104, an FCCU[0:1] IO integrity monitor 106, a reset IO integrity monitor 110, an external signal integrity monitor 108, a reset controller 112, and other MCU circuitry 114. IO padring 116 includes an FCCU[0:1] output circuit 118, a reset IO circuit 122, and other I/O circuit(s) 120. Any IO circuit, such as circuits 118, 120, and 122, includes a corresponding external terminal (e.g. IO pad or pin) and also includes, coupled thereto, an input circuit or an output circuit, or both an input and output circuit. Therefore, an external terminal, such as an IO pad, can receive an input signal, provide an output signal, or both. Any of the IO circuits may include corresponding ESD protection circuitry coupled to the external terminal.

FCCU 104 may generate any number of fault control bits which can be communicated within SoC 102 or with external circuitry. For example, FCCU[0:1] output circuit receives two fault control bits from FCCU 104, and may therefore include two pads to communicate these two bits external to SoC 102, such as to external chip 130. FCCU[0:1] output circuit 118 provides tap signals 124 to FCCU[0:1] IO integrity monitor 106. Tap signals 124 may include one or more tap signals and may also be referred to as taps 124. Reset IO circuit 122 provides tap signals 126 to reset IO integrity monitor 110. Tap signals 126 may include one or more tap signals and may also be referred to as taps 126. Reset IO circuit 122 is also bidirectionally coupled to reset controller 112. Reset controller 112, based on reset signals from reset IO circuit 122, determines when to reset SoC 102 (i.e. reset the MCU of SoC 102) and asserts the system reset.

Other IO circuit(s) 120 may include other IO circuitry capable of communicating with FCCU 104 or other portions of SoC 102, and is capable of communicating signals with external circuitry as well. One or more external signal integrity monitor(s) 108 receives one or more tap signals from other IO circuit(s) 120. Note also that, in alternate embodiments, FCCU 104 can be implemented as another type of multi-bit control unit.

FCCU[0:1] integrity monitor 106 provides an integrity fault indicator 107 to FCCU 104, and reset IO integrity monitor 110 provides an integrity fault indicator 111 to FCCU 104. FCCU 104 is also coupled to reset controller 112 and other MCU circuitry 114. Similarly, external signal integrity monitor(s) 108 provide one or more corresponding integrity fault indicators to FCCU 104. MCU circuitry 114 includes any other portion of MCU circuitry which communicates with FCCU 104, in which FCCU 104 collect fault information from SoC 102 in order to determine if SoC 102 is exhibiting correct functionality.

External chip 130 includes an IO padring 132, safety circuitry 140, and a reset generation circuit 142. IO padring 132 includes an FCCU[0:1] input circuit 134, a reset IO circuit 138, and other I/O circuit(s) 136. Any IO circuitry, such as circuits 134, 136, and 138, includes a corresponding external terminal (e.g. IO pad) and includes an input circuit or an output circuit, or both an input and output circuit. Also, in the illustrated embodiment, any of the IO circuits of chip 130 may include corresponding ESD protection circuitry. FCCU[0:1] input circuit is coupled to safety circuitry 140, reset IO circuit 138 is coupled to reset generation circuit 142, and safety circuitry 140 and reset generation circuit are bidirectionally coupled.

FCCU[0:1] output circuit 118 provides the FCCU[0:1] bits to the corresponding input circuit of chip 130, FCCU [0:1] input circuit 134. Reset IO circuit 122 receives a reset signal 128 from the corresponding output circuit of chip 130, reset IO circuit 138. Note that reset IO circuit 122 can communicate other reset signals with reset IO circuit 138. Other IO circuits 120 of SoC 102 communicates with other corresponding IO circuits 136 of chip 130. Note that SoC 102 and chip 130 may each also include other circuitry to perform other functions not illustrated in FIG. 1.

Functional safety of an SoC relies on correct operation of protection or safety functions as well as on correct communication with external chips. For example, functional safety of SoC 102 cannot be guaranteed even if FCCU 104 and other safety hardware are operational and correct, because the overall safety can be contaminated by untrustworthy FCCU bits and reset signals which may be caused, for example, by malfunctioning padring circuitry. The contamination of the FCCU control bits and reset signals can occur in many places along the communication path and there is typically no way to detect or isolate the source of the error. In a noisy environment, it is possible that the IO padrings of both chips (e.g. SoC 102 and chip 130) malfunction. A malfunctioning padring circuit may also result in instability of the corresponding power domain.

The FCCU/Reset signal exchange chain my include FCCU[0:1] output circuit 118 of SoC 102 providing FCCU [0:1] to FCCU[0:1] input circuit 134 of chip 130, FCCU[0: 1] circuit 134 communicating the FCCU[0:1] bits with safety circuitry 140 located within the core of chip 130, safety circuitry 140 communicating with reset generation circuit 142, reset generation circuit 142 communicating with reset IO circuit 138, which provides reset signal 128 to reset IO circuit 122. Therefore, even if the MCU of SoC 102 can self-correct errors at any block within SoC 102, correct decisions for self-correcting or ensuring proper operation cannot be done if the information it receives is wrong.

For example, if FCCU[0:1] output circuit 118 is malfunctioning, the FCCU[0:1] bits communicated to external chip 130 are untrustworthy. In this situation, since operation of chip 130 is based on questionable FCCU[0:1] bits, the reset signal or reset signals from chip 130 back to SoC 102 are also questionable, even if reset IO circuit 122 is not malfunctioning. As a result, MCU operation in SoC 102 is not considered to be safe. Similarly, if reset IO circuit 122 is malfunctioning, MCU reset controller 112 makes its determination of whether or not to reset the MCU of SoC 102 based on questionable reset signals, even if FCCU[0:1] output circuitry 118 is not malfunctioning. As a result, MCU operation in SoC 102 is also not considered to be safe. In the case in which both FCCU[0:1] output circuit 118 and reset IO circuit 122 are malfunctioning, then both the FCCU[0:1] bits communicated to external chip 130 and the reset signal from chip 130 back to SoC 102 are questionable. In this situation, operation of chip 130 is based on questionable FCCU[0:1] bits, and the decision by reset controller 112 to reset or not reset the MCU is based on a questionable reset signal. As a result, MCU operation in SoC 102 is not considered safe.

It is therefore possible that an error can occur in any step of the FCCU/Reset signal exchange chain between FCCU [0:1] output circuit 118 through chip 130 and back to reset IO circuit 122, due, for example, to a malfunction in padring 116 or padring 132 or both. If any of these errors occur, resulting in untrustworthy or questionable information, then the operation of the MCU of SoC 102 cannot be deemed safe. In general, a false negative can be especially problematic in which, based on questionable reset signals, operation of SoC 102 may be deemed to be safe when in fact it is not because padring 116 or padring 132 is malfunctioning. In this case, SoC 102 is erroneously not reset when it should be. Functional safety must therefore take into consideration the integrity of padring operation in system 100.

As illustrated in FIG. 1, integrity monitors 106 and 110 determine the integrity of information based on proper functioning of the corresponding IO circuit in padring 116, and provide integrity fault indicators 107 and 111, respectively. That is, if the IO circuitry of padring 116 is functioning properly, the corresponding integrity fault indicator is negated and it is assumed that the signals processed by the corresponding IO circuit are trustworthy. If, however, the IO circuitry is not functioning properly, the corresponding integrity fault indicator is asserted and it can be assumed that the signals received or provided at the corresponding IO circuit are questionable and not trustworthy. In this case, FCCU 104 can indicate to reset controller 112 that integrity of padring 116 may be compromised, and in response, reset controller 112 can perform a self-reset of SoC 102. Alternatively, FCCU 104 can use the integrity fault indicators to result in a reset of the FCCU[0:1] bits to chip 130, request chip 130 to perform a self check, reset its reset signal, or any other actions as dictated by the design of system 100.

Figure 2:
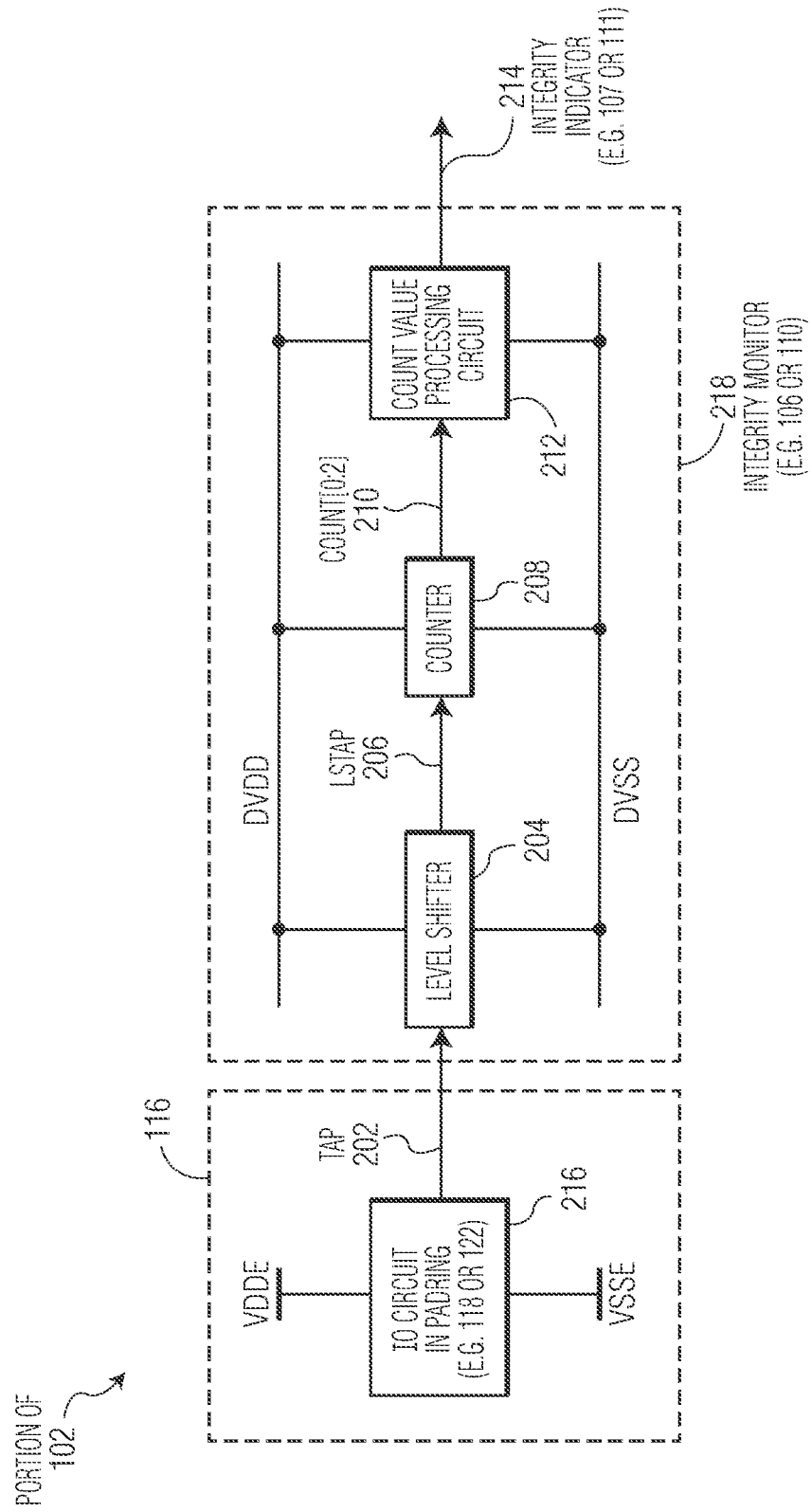
FIG. 2 illustrates, in block diagram form, a portion of the SoC of FIG. 1, including a portion of a padring and an integrity monitor, in accordance with one embodiment of the present invention.

FIG. 2 illustrates a portion of padring 116 and an integrity monitor 218, in accordance with an embodiment of the present invention. Padring 116 includes an IO circuit 216 in a first power domain powered by a first voltage differential and having a first supply terminal configured to receive a first supply voltage, VDDE, and a second supply terminal configured to receive a second supply voltage, VSSE, in which VDDE is greater than VSSE. Note that herein, VDDE and VSSE may also be used to refer to the first and second supply terminal, respectively. IO circuit 216 may correspond to any IO circuit of padring 116, such as, for example, output circuit 118, IO circuit 122, or any of the other IO circuits 120. Also, IO circuit 216 may include an external terminal (e.g. IO pad), corresponding ESD protection circuitry, and any corresponding input or output buffer circuitry (or both input and output buffer circuitry). A signal from an internal circuit node of IO circuit 216 is provided as a tap signal 202 (i.e. tap 202) to integrity monitor 218. An internal circuit node of IO circuit 216 can be any node within the IO circuit, such as within the ESD protection circuitry, or any input or output buffer circuitry, but is not VDDE or VSSE. Preferably, the internal circuit node of IO circuit 216 is a node which reflects changes or fluctuations in VDDE or VSSE or both. IO circuit 216 may provide any number of tap signals (also referred to as taps or tap out signals). Also, one or more of the internal circuit nodes of IO circuit 216 can be pre-processed and aggregated to form each tap signal.

Integrity monitor 218 may correspond to any integrity monitor of SoC 102, such as integrity monitor 106 or 110. Integrity monitor 218 is located in a second power domain powered by a second voltage differential and having a first supply terminal configured to receive a first supply voltage, DVDD, and a second supply terminal configured to receive a second supply voltage, DVSS, in which DVDD is greater than DVSS. Note that herein, DVDD and DVSS may also be used to refer to the first and second supply terminal of the second power domain, respectively. In one embodiment, the first power domain and the second power domain are different power domains, and the first power domain is a higher voltage domain as compared to the second power domain. In this case, VDDE is greater than DVDD, and in general, the devices in the first voltage domain have a greater voltage rating than those in the second power domain. Although the first and second voltage domains may be different, VSSE and DVSS may be a same voltage level. By being in a different power domain than IO circuit 216, any disturbance in the padring power (VDDE of the first power domain) does not corrupt integrity monitor 218. Note that integrity monitor 218 may also be referred to as a sensing circuit.

Integrity monitor 218 includes a level shifter 204, a counter 208, and a count value processing circuit 212, each powered by DVDD and DVSS. Level shifter 204 provides an interface between the first and second power domains so that the circuits in integrity monitor 218 avoid voltage stress. Therefore, tap 202, which may vary between VDDS and VDDE, is received at an input of level shifter 204 and the level shifted tap signal, LS tap 206, which may vary between DVSS and DVDD, is provided at the output of level shifter 204. Any type of level shifter may be used. For example, level shifter 204 may be an analog-to-digital converter which provides information on the voltage level of the tap signals. In one embodiment, depending on the voltage levels of the first and second power domains and on the devices in the second power domain, a level shifter may not be necessary. In this case, tap 202 would be provided to counter 208.

Counter 208 includes an n-bit digital counter. In the illustrated embodiment, counter 208 includes a 3-bit counter, providing a 3-bit count value (count[0:2]) at its output based on LS tap 206 received at its input. In one embodiment, counter 208 counts how many times LS tap 206 crosses a threshold voltage. This provides information as to the stability of the tap signal which reflects stability of the power supply, VDDE, of the first power domain. Counter 208 can monitor the evolution of a disturbance reflected in the tap signals, and can encode and record properties of the disturbance (e.g. magnitude, duration, speed/frequency, etc.) into a few bits of digital signals, facilitating any post-processing by count value processing circuit 212. Therefore, in one embodiment, counter 208 also includes additional circuitry in addition to the n-bit counter, such as timers, or may include other additional counters. The count value at the output of counter 208 can be provided directly to FCCU 104, or alternatively, count value processing circuit 212 can further process the encoded signals from counter 208 into an FCCU compatible format.

Figure 3:
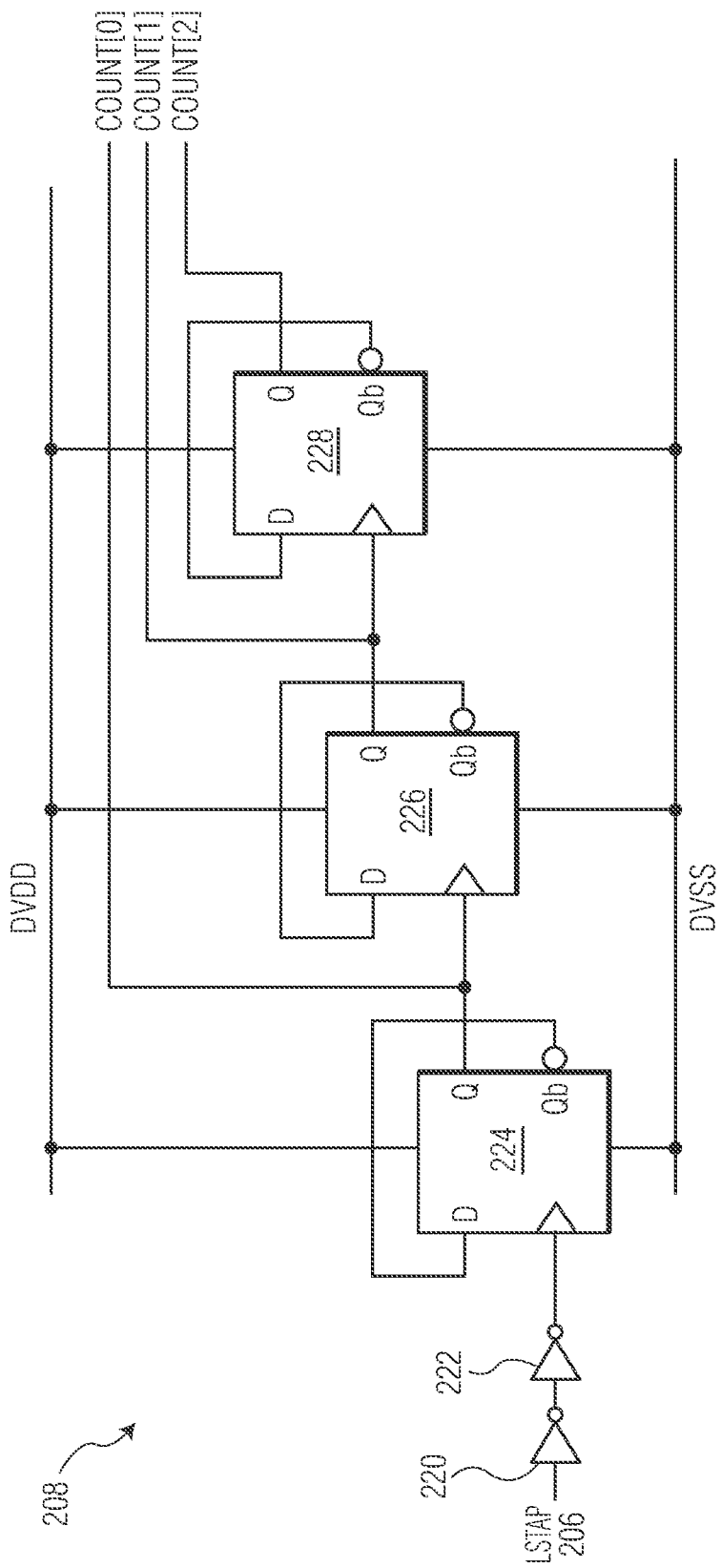
FIG. 3 illustrates in schematic form, a counter of the integrity monitor of FIG. 2, in accordance with one embodiment of the present invention.

FIG. 3 illustrates, in schematic form, counter 208 in further detail, in accordance with one embodiment of the present invention. Counter 208 includes inverters 220 and 222 and D flip-flops 224, 226, and 228. Inverter 220 has an input coupled to receive LS tap 206 and an output coupled to an input of inverter 222. An output of inverter 222 provides the value of LS tap 206. Inverters 220 and 22 operate to buffer LS tap 206 prior to reaching D flip-flop 224. Each D flip flop has a clock input, a data input, D, and outputs Q and Qb. When clocked (e.g. when a rising edge is received at the clock input), a D flip flop provides the value of D as output Q. Qb is the inverse (i.e. complement) of Q, and is indicated in FIG. 3 with a small circle at that the Qb output. Each D flip-flop is coupled between, and thus powered by, DVDD and DVSS.

D flip-flop 224 has a clock input coupled to the output of inverter 222 to receive LS tap 206 (i.e. the buffered version of LS tap 206). An output Qb of D flip-flop 224 is coupled to an input D of D flip-flop 224. An output Q of D flip-flop 224 is coupled to a clock input of D flip-flop 226. An output Qb of D flip-flop 226 is coupled to an input D of D flip-flop 226. An output Q of D flip-flop 226 is coupled to a clock input of D flip-flop 228. An output Qb of D flip-flop 228 is coupled to an input D of D flip-flop 228. Each of the Q outputs of D flip-flops 224, 226, and 228 provides one bit of the output count value. The Q output of flip-flop 224 provides count[0], corresponding to the least significant bit of the output count value. The Q output of flip-flop 226 provides count[1], and the Q output of flip-flop 228 provides count[2], corresponding to the most significant bit of the output count value.

In operation, upon each rising edge of LS tap 206, indicating that LS tap 206 increased enough to cross the trigger threshold of inverter 220 (which also results in a rising edge at the output of inverter 222), the value of D is provided at output Q and the inverse of Q is fed back to input D. At the immediately following rising edge, the value of D is again provided at output Q, thus toggling the value at Q. Therefore, at each rising edge of the output of inverter 222 (from a logic level 0 to a logic level 1), the output value of Q toggles. This output value is provided as the clock input of flip flop 226. In this manner, at each rising edge transition (from a logic level 0 to a logic level 1) of the output Q from D flip flop 224, the value of Q of D flip-flop 226 toggles. Similarly, at each rising edge transition (from a logic level 0 to a logic level 1) of the output Q from D flip flop 226, the value of Q of D flip-flop 228 toggles. In this manner, count[0:2] provides a 3-bit count value representative of the number of rising edges of LS tap 206 (corresponding to each time LS tap 206 reaches a predetermined threshold, corresponding in this embodiment to the trigger threshold of inverter 220).

In alternate embodiments, different counter circuits may be used to implement the counting function of counter 208. For example, a counter which decrements instead of increments may be used, or a counter which counts on falling edges instead of rising edges may be used. Also, different logic circuits can be used in place of or in addition to inverters 220 and 222 to set the appropriate thresholds for triggering a count (e.g. an increment or a decrement in the count value). Alternate embodiments may use more complex circuits to also determine magnitude and duration each variation in LS tap 206. In addition, timers may be used to determine other characteristics of the tap signal, such as frequency or speed.

Still referring to FIG. 3, the output of counter 208 is provided to count value processing circuit 212 which selectively asserts integrity fault indicator 214 based on the received count value. Integrity fault indicator 214 may be, for example, integrity fault indicator 107 (selectively asserted in response to monitoring a tap in FCCU[0:1] IO output circuit 118) or may be integrity fault indicator 111 (selectively asserted in response to monitoring a tap in reset IO circuit 122). The assertion of integrity fault indicator 214 indicates that any signal processed by the corresponding IO circuit is untrustworthy, which may be due to disturbances in the power domain of the corresponding IO circuit. Also, counter 208 along with level shifter 204, if present, and count value processing circuit 212 are located in a different power domain than that of IO circuit 216 so that any disturbances in the power domain of IO circuit 216 do not also affect integrity of counter 208, level shifter 204, and count value processing circuit 212.

Count value processing circuit 212 asserts integrity fault indicator 214 based on the count value received from counter 208. For example, count value processing circuit 212 may assert integrity fault indicator 214 when the count value reaches a predetermined count value threshold. In one embodiment, it is asserted when the count value saturates (when it increments to its maximum value or decrements to its minimum value, such as the binary value 111 or 000 for a 3-bit counter). As described above, the count value may reflect fluctuations in the power domain of IO circuitry 216. These fluctuations or disturbances result in changes in the tap signals which trigger counter 208 to count (i.e. increment or decrement) and may result in assertion of integrity fault indicator 214. For example, if VDDE is oscillating or otherwise unstable, counter 208 would continue to count (e.g. increment or decrement) until reaching the predetermined count value threshold, resulting in assertion of integrity fault indicator 214. Assertion of integrity fault indicator 214 indicates that the signals provided by or received by the corresponding IO circuit may be untrustworthy due to possible instability of VDDE. For example, if integrity fault indicator 107 is asserted, FCCU[0:1] provided from SoC 102 or received from chip 130 may be questionable or untrustworthy or if integrity fault indicator 111 is asserted, reset signals provided from SoC 102 or received from chip 130 may be questionable or untrustworthy. In response to assertion of an integrity fault indicator, different actions may be taken. In one embodiment, assertion of any integrity fault indicator in SoC 102 results in a reset of SoC 102. Alternatively, partial resets may be performed, or other actions may be taken.

In alternate embodiments, count value processing circuit 212 may use information in addition to the received count value to assert or negate integrity fault indicator 214. For example, timers may be used in addition to the count value of counter 208 so that count value processing circuit 212 can assert or negate integrity fault indicator 214 based on different or additional characteristics than just the count value. For example, these characteristics may relate to speed, magnitude, duration, etc., of the tap signal fluctuations.

Figure 4:
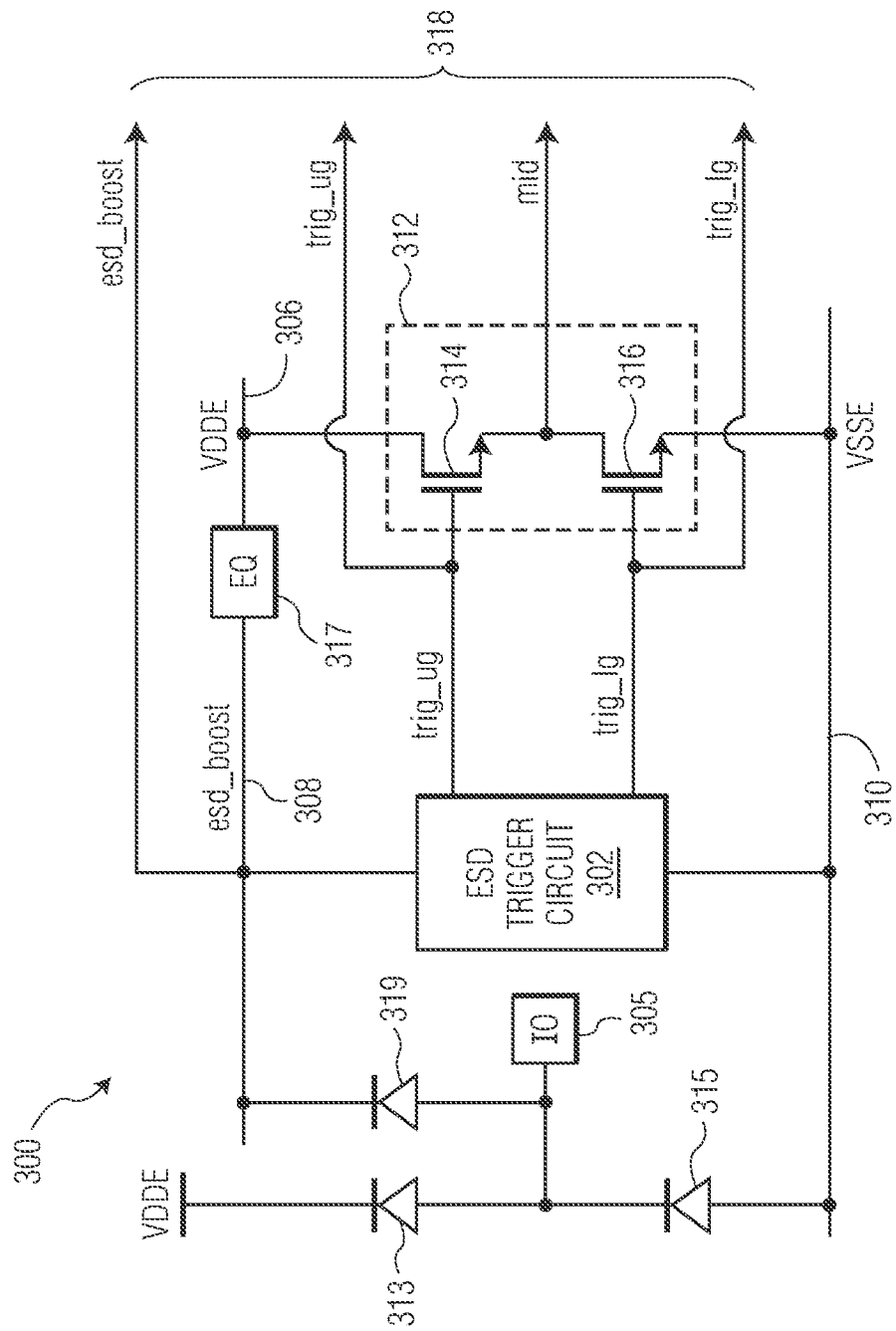
FIG. 4 illustrates a portion of an ESD protection circuit which may be present in the padring portion of FIG. 2, in accordance with one embodiment of the present invention.

FIG. 4 illustrates, in partial block diagram and partial schematic form, an ESD protection circuit 300 in accordance with one embodiment of the present invention. ESD protection circuit 300 may reside in the padring in any IO circuit, such as in IO circuit 216 in padring 116 of FIG. 2. In the embodiment shown, ESD protection circuit 300 includes an external terminal (e.g. IO pad 305) for receiving or supplying (or both receiving and supplying) an information signal. ESD protection circuit is coupled to the supply terminals VDDE via a VDDE power rail 306 and VSSE via a VSSE power rail 310, and also includes an ESD boost bus, esd_boost 306. The boost bus may be characterized as a power rail for ESD circuitry. Padring 116 may include more external terminals (not shown), and may include anytime type of external terminal (e.g. pads, posts, bumps, etc.).

ESD protection circuit 300 includes diodes 313, 319, and 315 for shunting current from an ESD event from IO pad 319 (or from a power supply terminal such as VDDE or VSSE) to both VDDE power rail 306 and esd_boost 308. During an ESD event, current shunted to esd_boost 308 and VDDE power rail 306 raises the voltage of esd_boost 308 such that a trigger circuit 302 will assert trigger signals (trig_ug and trig_lg) to make conductive clamps 314 and 316 of stacked clamps 312 to clamp VDDE rail 306 to VSSE rail 310 such that the ESD event current is discharged to rail 310 and to reduce the large voltage differential across circuitry of SoC 302 due to the ESD event. A middle node, mid, of stacked clamp 312 corresponds to the circuit node between transistors 314 and 316. In the illustrated embodiment, claims 314 and 316 are implemented as NFETs. During an ESD even applied to pad 305, high ESD currents flow through diode 313 to VDDE rail 306, and then to VSSE rail 310, via clamps 314 and 316. A much smaller current is needed to power trigger circuit 302 via diode 319 to esd_boost 308. Due to the differences in current magnitude, and related IR drops in the two current paths, trigger circuit 302 sees a boost voltage of esd_bus 308 often well in excess of a voltage of VDDE bus 306 seen by the drain terminal of clamp 314. The result is that the control electrodes (e.g. gates) of clamps 314 and 316 are often driven well above the voltage of VDDE rail 306. This can significantly increase the conductance of clamps 314 and 316, such that the desired clamp can be achieved.

In the illustrated embodiment, ESD protection circuit 300 includes an equalizer 317 (also referred to as a boost circuit) to allow esd_boost 308 to rise to a higher voltage than VDDE rail 306 during assertion of the trigger signals so as to turn on clamps 314 and 316 more strongly, while keeping esd_boost 308 and VDDE rail 306 at the same potential when the trigger signals are not asserted. In one embodiment, equalizer 317 can be implemented with a resistor coupled between the source and drain of a PFET transistor, whose control electrode is coupled to receive trig_ug. However, in alternate embodiments, equalizer 317 can have any type of configuration. In the illustrated embodiment, one or more of esd_boost 308, trig_ug, trig_lg, and mid can provide tap signals 318. For example, one of tap signals 318 can be provided as tap signal 202 from IO circuit 216 to integrity monitor 218.

IO circuit 216, in addition to an ESD protection circuit, may also include input or output buffer circuitry. Furthermore, IO circuit 216 can be implemented using any configuration with any type of circuit elements. One or more of any internal circuit node or signal from any part of an IO circuit, such as IO circuit 216, regardless of how the IO circuit is implemented can be used to provide a tap signal to an integrity monitor. That is, a tap can also come from the input or output buffer circuitry of an IO circuit, and not just the ESD protection circuit. In one embodiment, a selected tap of an IO circuit corresponds to a circuit node which reflects variations (e.g. oscillations) of VDDE. In one embodiment, one integrity monitor, such as integrity monitor 218, is implemented for each tap from an IO circuit. Alternatively, an integrity monitor can be shared among multiple taps, such as in a time multiplexed manner.

Therefore, by now it can be appreciated how the integrity of signals provided or received at a padring of an SoC can be monitored so as to indicate when the integrity of the signals may be compromised, due, for example, to disturbances in the power domain of the IO circuits. In one embodiment, an integrity monitor uses a counter to monitor a tap signal from an internal node of IO circuitry and uses a count value of the counter to provide a corresponding integrity fault indicator to indicate trustworthiness. The counter may count each time the tap signal crosses a predetermined threshold. Fluctuations in the tap signal may indicate instability of the power domain of the IO circuitry. When the count value reaches a threshold count value, such as when it reaches saturation, the integrity fault indicator is asserted. When asserted, integrity of a signal is questionable and thus cannot be deemed trustworthy. In response to assertion of an integrity fault indicator, various different responses can be taken, such as performing a system reset.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Also for example, in one embodiment, the illustrated elements of SoC 102 are circuitry located on a single integrated circuit or within a same device and the illustrated elements of chip 130 are circuitry located on a single integrated circuit or within a same device. Alternatively, all of system 100 may be on a single integrated device or may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different types of signaling may be used to provide the integrity fault indicator to a fault controller. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit (IC) includes an input/output (IO) circuit in a first power domain, coupled between a first power supply terminal and a second power supply terminal, wherein the first and second power supply terminals correspond to the first power domain; and an integrity monitor in a second power domain, coupled between a third power supply terminal and a fourth power supply terminal, wherein the third and fourth power supply terminals correspond to the second power domain. The IO circuit includes an external terminal configured to communicate signals external to the IC, and an internal circuit node configured to provide a tap signal, wherein the internal circuit node is neither the first power supply terminal nor the second power supply terminal. The integrity monitor having a counter configured to provide a count value by counting each time the tap signal reaches a threshold voltage, and configured to provide an integrity fault indicator based at least in part on the count value, in which the integrity fault indicator indicates whether or not a signal provided or received by the external terminal is trustworthy. In one aspect of this embodiment, the first power domain is a higher voltage domain than the second power domain. In a further aspect, the first power supply terminal is configured to receive a first supply voltage and the third power supply terminal is configured to receive a second supply voltage which is lower than the first supply voltage. In yet a further aspect, the second power supply terminal and the fourth power supply terminal are configured to receive a same supply voltage. In another aspect of this embodiment, the integrity monitor further includes a level shifter configured to level shift the tap signal from the first power domain to the second power domain, and wherein the counter is configured to provide the count value by counting each time the level shifted tap signal reaches the threshold voltage. In another aspect, the counter includes an even number of inverters in series configured to process the tap signal. In a further aspect, the counter includes a plurality of flip flops configured to provide the count value using the processed tap signal from an output of the even number of inverters. In another aspect, the IO circuit includes an Electrostatic Discharge (ESD) protection circuit, wherein the internal circuit node configured to provide the tap signal is an internal circuit node of the ESD protection circuit. In a further aspect, the internal circuit node is a circuit node between stacked transistors of an ESD clamp in the ESD protection circuit, wherein the ESD clamp is coupled between the first voltage supply terminal and the second voltage supply terminal. In another further aspect, the internal circuit node is a circuit node at a gate of a transistor of an ESD clamp in the ESD protection circuit, wherein the ESD clamp is coupled between the first voltage supply terminal and the second voltage supply terminal. In yet another further aspect, the internal circuit node is a circuit node at an ESD boost bus of the ESD protection circuit, wherein the ESD boost bus is coupled to the first power supply terminal via an equalizer circuit. In another aspect of the above embodiment, the IO circuit includes an IO buffer circuit, wherein the internal node configured to provide the tap signal is an internal node of the IO buffer circuit. In another aspect, the IO circuit is in a padring of the IC, and the padring is in the first voltage domain.

In another embodiment, in an input/output (IO) circuit of an integrated circuit (IC) having an external terminal configured to communicate signals with another IC, a method includes providing a tap signal from an internal circuit node, wherein the circuit node is not a node at a power supply terminal of the IO circuit; using a counter to obtain a count value of how many times the tap signal reaches a threshold voltage; and providing an integrity fault indicator based at least in part on the count value, wherein the integrity fault indicator indicates whether or not a signal provided or received by the external terminal is trustworthy. In one aspect of the another embodiment, the IO circuit is in a first power domain of the IC and the counter is in a second power domain of the IC, lower than the first power domain. In another aspect, the method further includes level shifting the tap signal provided to by the internal circuit node prior to using the counter to obtain the count value. In another aspect, the method further includes using an Electrostatic Discharge (ESD) protection circuit to prove ESD protection to the external terminal, wherein the internal circuit is a circuit node internal to the ESD protection circuit.

In yet another embodiment, an integrated circuit (IC) includes an input/output (IO) circuit in a first power domain, coupled between a first power supply terminal and a second power supply terminal, wherein the first and second power supply terminals correspond to the first power domain, and an integrity monitor in a second power domain, coupled between a third power supply terminal and a fourth power supply terminal, wherein the third and fourth power supply terminals correspond to the second power domain. The IO circuit includes an external terminal configured to communicate signals external to the IC, an Electrostatic Discharge (ESD) protection circuit configured to protect the external terminal and the first power supply terminal from ESD events, and an internal circuit node configured to provide a tap signal, wherein the internal circuit node is a circuit node internal to the ESD protection circuit. The integrity monitor includes a counter configured to provide a count value by counting each time the tap signal increases or decreases to a threshold voltage, and is configured to assert an integrity fault indicator when the count value reaches a count value threshold to indicate that a signal provided or received by the external terminal is not trustworthy. In one aspect of the yet another embodiment, the internal circuit node is a circuit node between stacked transistors of an ESD clamp in the ESD protection circuit, wherein the ESD clamp is coupled between the first voltage supply terminal and the second voltage supply terminal. In another aspect, the first power domain is a higher power domain that the second power domain, and the integrity monitor further includes a level shifter configured to level shift the tap signal from the first power domain to the second power domain, and wherein the counter is configured to provide the count value by counting each time the level shifted tap signal increases or decreases to the threshold voltage.

What is claimed is:

1. An integrated circuit (IC), comprising:
   an input/output (TO) circuit in a first power domain, coupled between a first power supply terminal and a second power supply terminal, wherein the first and second power supply terminals correspond to the first power domain, the IO circuit including:
      an external terminal configured to communicate signals external to the IC, and
      an internal circuit node configured to provide a tap signal, wherein the internal circuit node is neither the first power supply terminal nor the second power supply terminal; and
   an integrity monitor in a second power domain, coupled between a third power supply terminal and a fourth power supply terminal, wherein the third and fourth power supply terminals correspond to the second power domain, the integrity monitor:
      having a counter configured to provide a count value by counting each time the tap signal reaches a threshold voltage, and
      configured to provide an integrity fault indicator based at least in part on the count value, in which the integrity fault indicator indicates whether or not a signal provided or received by the external terminal is trustworthy.

2. The IC of claim 1, wherein the first power domain is a higher voltage domain than the second power domain.

3. The IC of claim 2, wherein the first power supply terminal is configured to receive a first supply voltage and the third power supply terminal is configured to receive a second supply voltage which is lower than the first supply voltage.

4. The IC of claim 3, wherein the second power supply terminal and the fourth power supply terminal are configured to receive a same supply voltage.

5. The IC of claim 1, wherein the integrity monitor further comprises:
   a level shifter configured to level shift the tap signal from the first power domain to the second power domain, and wherein the counter is configured to provide the count value by counting each time the level shifted tap signal reaches the threshold voltage.

6. The IC of claim 1, wherein the counter comprises an even number of inverters in series configured to process the tap signal.

7. The IC of claim 6, wherein the counter comprises a plurality of flip flops configured to provide the count value using the processed tap signal from an output of the even number of inverters.

8. The IC of claim 1, wherein the IO circuit comprises an Electrostatic Discharge (ESD) protection circuit, wherein the internal circuit node configured to provide the tap signal is an internal circuit node of the ESD protection circuit.

9. The IC of claim 8, wherein the internal circuit node is a circuit node between stacked transistors of an ESD clamp in the ESD protection circuit, wherein the ESD clamp is coupled between the first voltage supply terminal and the second voltage supply terminal.

10. The IC of claim 8, wherein the internal circuit node is a circuit node at a gate of a transistor of an ESD clamp in the ESD protection circuit, wherein the ESD clamp is coupled between the first voltage supply terminal and the second voltage supply terminal.

11. The IC of claim 8, wherein the internal circuit node is a circuit node at an ESD boost bus of the ESD protection circuit, wherein the ESD boost bus is coupled to the first power supply terminal via an equalizer circuit.

12. The IC of claim 1, wherein the IO circuit comprises an IO buffer circuit, wherein the internal node configured to provide the tap signal is an internal node of the IO buffer circuit.

13. The IC of claim 1, wherein the IO circuit is in a padring of the IC, and the padring is in the first voltage domain.

14. In an input/output (IO) circuit of an integrated circuit (IC) having an external terminal configured to communicate signals with another IC, a method comprising:
   providing a tap signal from an internal circuit node, wherein the circuit node is not a node at a power supply terminal of the IO circuit;
   using a counter to obtain a count value of how many times the tap signal reaches a threshold voltage, wherein the IO circuit is in a first power domain of the IC and the counter is in a second power domain of the IC, lower than the first power domain; and
   providing an integrity fault indicator based at least in part on the count value, wherein the integrity fault indicator indicates whether or not a signal provided or received by the external terminal is trustworthy.

15. The method of claim 14, further comprising:
   level shifting the tap signal provided to by the internal circuit node prior to using the counter to obtain the count value.

16. The method of claim 14, further comprising:
   using an Electrostatic Discharge (ESD) protection circuit to prove ESD protection to the external terminal, wherein the internal circuit is a circuit node internal to the ESD protection circuit.

17. An integrated circuit (IC), comprising:
   an input/output (IO) circuit in a first power domain, coupled between a first power supply terminal and a second power supply terminal, wherein the first and second power supply terminals correspond to the first power domain, the IO circuit including:
      an external terminal configured to communicate signals external to the IC,
      an Electrostatic Discharge (ESD) protection circuit configured to protect the external terminal and the first power supply terminal from ESD events, and
      an internal circuit node configured to provide a tap signal, wherein the internal circuit node is a circuit node internal to the ESD protection circuit; and
   an integrity monitor in a second power domain, coupled between a third power supply terminal and a fourth power supply terminal, wherein the third and fourth power supply terminals correspond to the second power domain, the integrity monitor:
      having a counter configured to provide a count value by counting each time the tap signal increases or decreases to a threshold voltage, and
      configured to assert an integrity fault indicator when the count value reaches a count value threshold to indicate that a signal provided or received by the external terminal is not trustworthy.

18. The IC of claim 17, wherein the internal circuit node is a circuit node between stacked transistors of an ESD clamp in the ESD protection circuit, wherein the ESD clamp is coupled between the first voltage supply terminal and the second voltage supply terminal.

19. The IC of claim 17, wherein the first power domain is a higher power domain that the second power domain, and the integrity monitor further comprises:

a level shifter configured to level shift the tap signal from the first power domain to the second power domain, and wherein the counter is configured to provide the count value by counting each time the level shifted tap signal increases or decreases to the threshold voltage.

20. In an input/output (IO) circuit of an integrated circuit (IC) having an external terminal configured to communicate signals with another IC, a method comprising:
  providing a tap signal from an internal circuit node, wherein the circuit node is not a node at a power supply terminal of the IO circuit;
  using a counter to obtain a count value of how many times the tap signal reaches a threshold voltage;
  level shifting the tap signal provided by the internal circuit node prior to using the counter to obtain the count value; and
  providing an integrity fault indicator based at least in part on the count value, wherein the integrity fault indicator indicates whether or not a signal provided or received by the external terminal is trustworthy.

* * * * *